(12) United States Patent
Langen

(10) Patent No.: US 7,267,129 B2
(45) Date of Patent: *Sep. 11, 2007

(54) DEVICE AND PROCESS FOR LIQUID TREATMENT OF WAFER-SHAPED ARTICLES

(75) Inventor: Kurt Langen, Villach (AT)

(73) Assignee: SEZ AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 11/367,330

(22) Filed: Mar. 6, 2006

(65) Prior Publication Data

US 2006/0144429 A1    Jul. 6, 2006

Related U.S. Application Data

(62) Division of application No. 10/632,962, filed on Aug. 4, 2003, now Pat. No. 7,007,702, which is a division of application No. 10/164,424, filed on Jun. 10, 2002, now Pat. No. 6,858,092, and a division of application No. 09/556,426, filed on Apr. 24, 2000, now Pat. No. 6,435,200.

(51) Int. Cl.
*B05C 13/00* (2006.01)
*B08B 3/00* (2006.01)

(52) U.S. Cl. ............. 134/99.1; 134/140; 134/149; 134/153; 134/157; 134/902; 118/52

(58) Field of Classification Search ............. 134/137, 134/140, 149, 153, 157, 201, 902; 118/52
See application file for complete search history.

(56) References Cited

U.S. PATENT DOCUMENTS

| | | | |
|---|---|---|---|
| 4,903,717 A * | 2/1990 | Sumnitsch | 134/99.1 |
| 5,608,943 A | 3/1997 | Konishi et al. | |
| 5,706,843 A | 1/1998 | Matsuo | |
| 5,769,945 A | 6/1998 | Davis et al. | |
| 5,861,061 A | 1/1999 | Hayes et al. | |
| 5,871,584 A | 2/1999 | Tateyama et al. | |
| 5,896,877 A | 4/1999 | Pirker | |
| 5,904,164 A | 5/1999 | Wagner et al. | |
| 5,945,351 A | 8/1999 | Mathuni | |
| 6,013,136 A | 1/2000 | Mathuni | |
| 6,056,825 A * | 5/2000 | Sumnitsch | 118/730 |
| 6,095,582 A | 8/2000 | Siniaguine et al. | |
| 6,140,253 A * | 10/2000 | Hayes et al. | 438/782 |
| 6,140,254 A | 10/2000 | Endisch et al. | |
| 6,162,739 A | 12/2000 | Sumnitsch et al. | |
| 6,168,660 B1 * | 1/2001 | Hayes et al. | 118/52 |
| 6,221,157 B1 * | 4/2001 | Davis et al. | 118/52 |
| 6,316,367 B1 * | 11/2001 | Sumnitsch | 438/716 |
| 6,702,900 B2 * | 3/2004 | Yeh et al. | 118/730 |
| 7,172,674 B2 * | 2/2007 | Engesser | 156/345.19 |

FOREIGN PATENT DOCUMENTS

| | | |
|---|---|---|
| EP | 0 810 641 | 12/1997 |
| JP | 63-6843 | 1/1988 |
| JP | 9-181026 | 7/1997 |

* cited by examiner

*Primary Examiner*—Joseph L. Perrin
(74) *Attorney, Agent, or Firm*—Young & Thompson

(57) ABSTRACT

A device for liquid treatment of a defined area of a wafer-shaped article, especially of a wafer, near the edge, in which the liquid is applied to a first surface, flows essentially radially to the outside to the peripheral-side edge of the wafer-shaped article and around this edge onto the second surface, the liquid wetting a defined section near the edge on the second surface and thereupon being removed from the wafer-shaped article.

18 Claims, 1 Drawing Sheet

DEVICE AND PROCESS FOR LIQUID TREATMENT OF WAFER-SHAPED ARTICLES

CROSS-REFERENCE TO RELATED APPLICATIONS

This application is a Division of U.S. patent application Ser. No. 10/632,962 filed on Aug. 4, 2003 now U.S. Pat. No. 7,007,702, which is a division of application Ser. No. 10/164,424 filed on Jun. 10, 2002 now U.S. Pat. No. 6,858,092. Application Ser. No. 10/164,424 is a Division of U.S. patent application Ser. No. 09/556,426 filed on Apr. 24, 2000 now U.S. Pat. No. 6,435,200. The entire contents of the above-identified applications are hereby incorporated by reference.

BACKGROUND OF THE INVENTION

The invention relates to a device and a process for liquid treatment of a defined section of wafer-shaped article, a section near the edge, especially of a wafer.

The reason for treatment of a defined section of wafer-shaped article near the edge, especially of a wafer, will be described below.

A wafer, for example a silicon wafer, can for example have a silicon dioxide coating on all sides. For subsequent processes (if for example a layer of gold or a layer of polysilicon (polycrystalline silicon) is to be applied), it can be necessary to remove the existing coating from the wafer at least in the edge area of the main surface, but optionally also in the area of its peripheral surface and/or the second main surface. This is done by etching processes which can be divided mainly into dry etching processes and wet etching processes.

Another application is the cleaning of wafers. Here it can be necessary to clean a wafer at least in the edge area of a main surface, but optionally also in the area of its peripheral surface and/or the second main surface, i.e. to remove particles and/or other contamination. This is done by wet cleaning processes.

The invention is aimed at wet etching and wet cleaning (combined under the concept of liquid treatment). In doing so the surface area of the wafer to be treated is wetted with the treatment liquid and the layer which is to be removed or the impurities are carried off.

A device for executing this liquid treatment is described for example in U.S. Pat. No. 4,903,717. In this device the wafer-shaped article (wafer) is mounted on a spin chuck. The treatment liquid, for example, an etching liquid, is applied to the wafer surface to be treated, the liquid is distributed as a result of the rotational motion of the wafer over its surface and is flung off laterally over the edge of the wafer.

To prevent the treatment liquid from reaching the surface which is not be to treated in an uncontrolled manner, in U.S. Pat. No. 4,903,717 a chuck is proposed which flushes the surface which faces the chuck and which is not to be treated with a gas. In doing so the gas emerges between the wafer edge and the chuck.

JP 09-181026 A describes a chuck for semiconductor wafers which outside of an annular nozzle has a special shape, for example an annular step which falls away to the outside or a bevelling of its edge. In addition, a suction opening is proposed. This shaping of the intake opening is designed to influence (reduce) the flow velocity in the edge area. This is intended to serve such that the treatment liquid which has been applied from overhead flows beyond the edge of the wafer onto the side facing the chuck and treats the edge area there.

Regardless of whether a means to hold the wafer-shaped article (chuck) is used as claimed in U.S. Pat. No. 4,903,717 or JP 09-181026 A, an edge area of 1.5 mm (measured from the outer edge of the wafer) at most can be treated on the main surface facing the chuck. The liquid afterwards flows back in the direction of the wafer edge and is flung off by it.

SUMMARY OF THE INVENTION

Accordingly the object of the invention is to demonstrate one possibility for treating a defined, edge-side area with a liquid on one surface of a wafer-shaped article and it is also to be possible to treat an edge area of more than 2 mm (measured from the outside edge of the wafer).

Accordingly, the invention in its general embodiment proposes a device for liquid treatment of a defined section of a wafer-shaped article, especially a wafer, near the edge, with a means for holding the wafer-shaped article, with a gas feed means for at least partial gas flushing of the surface of the wafer-shaped article which faces the means, in which on the peripheral side there is a gas guide device which routes most of the flushing gas in the edge area of the wafer-shaped article away from the latter.

The holding means (chuck) is used to hold the wafer for this purpose. Here holding can be done using a vacuum or the wafer floats on an air cushion and is prevented from sliding off sideways by lateral guide elements.

The wafer can also be held by the gas which flows past on the bottom of the wafer forming a negative pressure (also called the Bernoulli effect) by which the wafer experiences a force in the direction of the chuck. The wafer is touched by an elevated part of the chuck within the gas feed device, by which the wafer is prevented from sliding off sideways.

Via the gas feed line the gas can be routed onto the bottom (the surface which faces the chuck) of the wafer-shaped article (wafer) in order to prevent the liquid from reaching this bottom and thus executing unwanted treatment. The gas used for this purpose should be inert to the surface onto which it is flowing; for example, nitrogen or extremely pure air are suited.

The gas feed means can consist of one or more nozzles or an annular nozzle. These nozzles should be attached symmetrically to the center of the chuck in order to enable uniform gas flow over the entire periphery.

The gas guide device is used to route the gas which flows from the middle part of the chuck in the direction of the edge of the wafer away from the edge area. The gas now flows past the side of the gas guide device which faces away from the wafer-shaped article. The farther inside (towards the center of the chuck) this gas guide device is attached, the larger the edge area is at this point.

Since in the section of the bottom of the wafer near the edge essentially gas can no longer flow to the outside, in treatment with the liquid the latter can flow around the wafer edge onto the bottom and thus can wet the section of the wafer bottom near the edge.

The advantage of the invention over the prior art is that the size of the section near the edge can be any size desired by means of suitable selection of the gas guide device.

The gas stream which flows past the gap between the gas guide device and the wafer can produce a negative pressure within the gap by suitable shaping of the gas guide, by which in addition in the edge area the gas flows from the vicinity of the wafer edge to the inside. During liquid treatment the liquid is thus sucked into the edge area.

In one embodiment the gas guide device has the shape of a ring. This ring can be attached to the base body of the chuck using for example three or more spacers. But it can also be machined out of the base body by corresponding milling.

The ring in one embodiment has an inside diameter which is smaller than the outside diameter of the wafer-shaped article and an outside diameter which is at least the same size as the outside diameter of the wafer-shaped article.

In this way the liquid which flows around the peripheral-side edge of the wafer-shaped article (around the wafer edge) can be captured by the ring and delivered to the inside.

The gas guide device can also be formed by an annular groove which is concentric to the periphery of the means and from which the gas is discharged to the outside. This can be ensured by simple holes which lead to the outside from the bottom of the groove in the base body of the chuck.

In another embodiment the gas guide device on its inner periphery has a sharp edge (edge angle less than 60°). In this way almost all the gas can be routed away in the edge area from the wafer.

In one embodiment the part of the means which is located between the gas feed means and the gas guide device (base body) is located at a greater distance to the wafer-shaped article (wafer) than the gas guide device to the wafer-shaped article. In this way more gas can flow between the wafer and this part (base body) than between the wafer and the gas guide device. Most of the gas on the side of the gas guide device facing away from the wafer must therefore flow past this device.

Advantageously the gas guide device is configured such that if there is a wafer-shaped article (wafer) on the chuck the gas guide device does not touch the wafer-shaped article (wafer), i.e. a gap remains between the wafer and the ring.

This gap between the gas guide device and the wafer-shaped article in one embodiment is 0.05 to 1 mm, advantageously 0.1 to 0.5 mm. In this way, between the wafer and the gas guide device a type of capillary forms, from which the liquid which has flowed around the wafer edge is sucked. The inside diameter of the surface which faces the gas guide device and which is wetted by the liquid is smaller than the inside diameter of the annular surface of the gas guide device.

It is advantageous if the surface of the gas guide device facing the wafer-shaped article is parallel to the main surfaces of the wafer-shaped article. The gap between the wafer-shaped article (wafer) and the gas guide device is thus the same size in the entire edge area.

One embodiment calls for the chuck being able to be caused to rotate. This is advantageous, even if not necessary, since the treatment liquid can be flung off both from the chuck and also the wafer edge. If the chuck is not in rotation during liquid treatment, the liquid is entrained or blown off by the gas flow.

Another part of the invention is a process for liquid treatment of a defined area of a wafer-shaped article, especially of a wafer, near the edge. In this process the liquid is applied to a first surface facing the liquid source. The liquid flows essentially radially to the outside to the peripheral-side edge of the wafer-shaped article (wafer edge) and around this edge onto the second surface which faces away from the liquid source. The liquid wets a defined section near the edge on the second surface and is thereupon removed from the wafer-shaped article.

The advantage over the prior art is that in this process the part of the liquid flow which reaches the section of the second surface near the edge also flows on the second surface in a stipulated direction (originating from the edge (wafer edge) in the direction of the wafer middle) and need not flow back again to the edge. Rather the liquid is removed from the inside edge of the section near the edge. This can take place for example with a device as claimed in the invention.

In one embodiment of the process the edge area is chosen to be larger than 2 mm.

In another embodiment of the process the wafer-shaped article during liquid treatment rotates around its axis, by which the treatment liquid is flung off the edge of the wafer-shaped article or the wafer edge.

Advantageously the rotational velocity is at least 100/min in order to effectively fling off the liquid.

BRIEF DESCRIPTION OF THE DRAWINGS

Other details, features and advantages of the invention follow from the description below for the embodiments of the invention which are shown in the drawings.

FIG. 3 shows the motion of the liquid during treatment.

DESCRIPTION OF THE PREFERRED EMBODIMENTS

Figure 1:
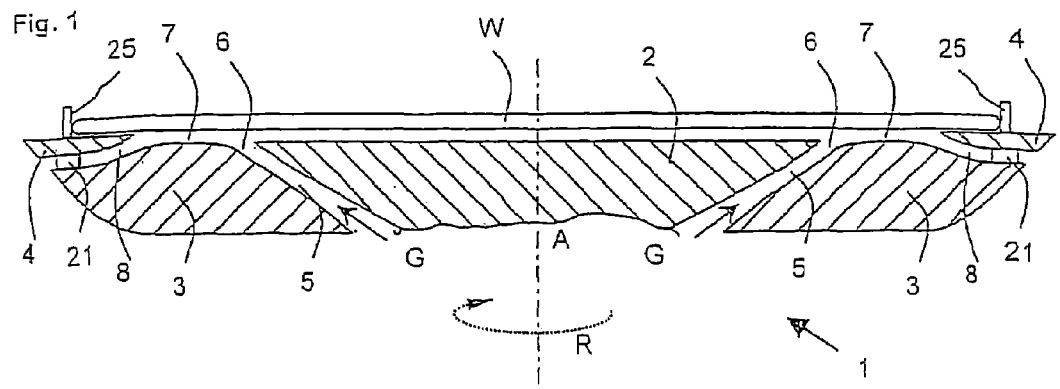
FIG. 1 schematically shows an axial section of the means (chuck 1) including a wafer which is located on it.

The chuck 1 consists essentially of three parts (2, 3, 4), the base body 3, the cover 2 and the gas guide device 4. The base body 3 is made annular and is joined to a hollow shaft (not shown) which on the one hand can cause the chuck to rotate (shown by the arrow R) and on the other hand can supply the gas feed means (5, 6) with gas G.

The cover 2 is inserted into the base body and is joined to it (not shown) such that between the cover 2 and the base body 3 an annular gas channel 5 is formed which on the top (the side facing the wafer) discharges into an annular gap, the annular nozzle 6. The diameter of the annular nozzle 6 is smaller than the inside diameter of the gas guide device 4.

This chuck works according to the "Bernoulli principle". Outside the annular nozzle 6 (in area 7) a gas cushion is formed on which the wafer floats. The wafer is prevented from sliding off sideways by guide elements which are attached on the peripheral side (pins 25) and the wafer is entrained by them when the chuck rotates around the axis A. The pins can be moved to rest against the edge of the wafer (compare U.S. Pat. No. 4,903,717).

The gas guide device 4 has the shape of a ring and is attached on the base body 3 on the top (the side facing the wafer) using a plurality of spacers 21 which are distributed regularly on the periphery. The ring 4 has an inside diameter which is smaller than the outside diameter of the wafer W and an outside diameter which is larger than the outside diameter of the wafer W.

The surface 14 of the gas guide device facing the wafer W is a flat annular surface which is parallel to the main surfaces of the wafer. Between the surface 14 and the surface of the wafer facing the chuck, when the wafer is located on the chuck, an annular gap 10 is formed. The depth of the gap c (FIG. 3) corresponds to the difference of the outside radius of the wafer W and the inside radius of the gas guide device 4. The width a (FIG. 2) is formed by the distance from the surface 14 to the wafer surface facing the chuck.

Between the gas guide device 4 and the base body 3 an annular gas discharge channel 8 is formed into which the gas is discharged by the gas guide device 4. The total cross section of the gap 10 is much smaller than that of the gas discharge channel 8, by which the channel can discharge most of the gas.

Figure 2:
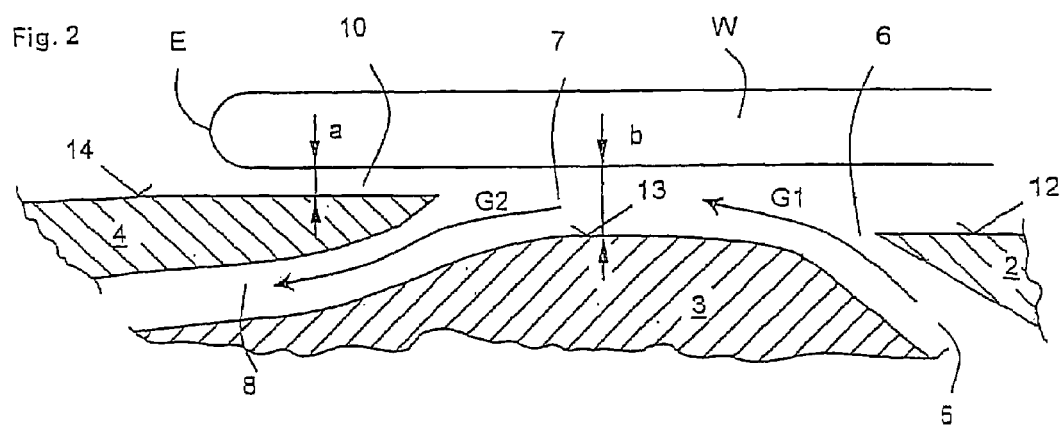
FIGS. 2 and 3 schematically show an axial section of the edge area of the chuck. Gas routing is apparent in it. Moreover
Figure 3:
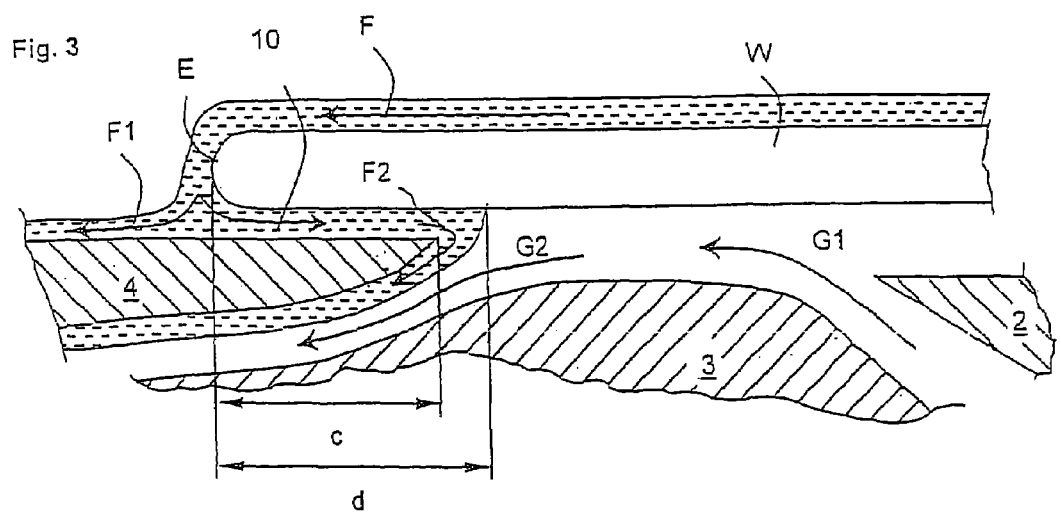

In the area 7 between the wafer W and the base body 3 or between the annular nozzle 6 and the gas guide device 4 the gas flows directly along the wafer surface facing the chuck. The narrowest cross section in this area is located between the surface 13 (the surface of the base body 3 facing the wafer) and the wafer and is shown in FIG. 2 by b. The distance b of the base body 3 to the wafer is larger than the distance a of the gas guide device to the wafer. The surface 12 of the cover 3 facing the wafer is located essentially in the same plane as the surface 13 of the base body.

If the wafer is located on the chuck, it is held suspended by the gas cushion in area 7, its touching neither the cover 2 nor the gas guide device 4. The gas escapes from the annular nozzle 6 (gas flow G1) and is discharged via the gas discharge channel 8 (gas flow G2). A small amount of gas can escape via the gap 10, but a negative pressure is probably produced by the gas flow G2, by which even gas from the vicinity is intaken via the gap 10 and is entrained by the gas flow G2.

During liquid treatment the liquid is applied to the surface facing the chuck 1, the liquid then flows in the direction of the wafer edge (liquid flow F) and around the wafer edge E. When the wafer rotates some of the liquid can 4 be flung off directly from the wafer edge (not shown). Then the liquid flow is divided into two flows F1 and F2. The liquid flow F1 flows away from the wafer.

The liquid flow F2 flows into the gap 10 and thus wets the bottom of the wafer. F2 wets the edge area of this surface somewhat farther than the gas guide device extends to the inside. Therefore the wetted area d is somewhat larger than the depth of the gap c. Here the liquid flow F2 is deflected by the gas flow G2 around the inner edge of the gas guide device and the liquid flow F2 and the gas flow G2 leave the chuck jointly via the gas discharge channel.

The invention claimed is:

1. A device for liquid treatment of an edge of a wafer-shaped article, comprising:
    a base and an annular gas guide element connected to said base and defining gas flow openings between an underside of said gas guide element and said base, said gas guide element comprising a substantially planar upper surface facing said wafer-shaped article and wherein a liquid capillary gap separates the planar upper surface and the wafer-shaped article;
    said base comprising at least one gas conduit that directs gas onto the surface of the wafer-shaped article facing said base and radially outwardly between said underside of said annular gas guide element and said base, wherein the at least one gas conduit opens on said base at a distance from the wafer-shaped article lower than an upper surface of said gas guide element.

2. The device of claim 1, wherein the gas guide element and the wafer-shaped article do not touch.

3. The device of claim 1, wherein the planar surface of the gas guide element and the surface of the wafer-shaped article facing the gas guide element are parallel.

4. The device of claim 1, wherein the liquid capillary between the gas guide element and the wafer-shaped article extends inwardly from the outside diameter of the wafer-shaped article greater than 1.5 mm.

5. The device of claim 1, wherein the device includes on its periphery a plurality of holding elements preventing the substrate from sliding off the device.

6. The device of claim 5, wherein said holding elements may be moved to rest against the substrate.

7. The device of claim 1, wherein said gas conduit is annular.

8. The device of claim 1, wherein said gas conduit comprises a plurality of conduits.

9. The device of claim 1, wherein said base comprises a fluid conduit.

10. The device of claim 1, wherein said capillary gap between the wafer-shaped article and the gas guide element is between 0.05 and 1 mm.

11. The device of claim 1, wherein said capillary gap between the wafer-shaped article and the gas guide element is between 0.1 to 0.5 mm.

12. The device of claim 1, wherein the gas guide element directs flowing gas away from the surface of the substrate facing the device.

13. The device of claim 1, wherein the gas directed onto the surface of the substrate assists in establishing the capillary gap.

14. The device of claim 13, wherein said assistance is by gas support of the wafer-shaped article.

15. The device of claim 13, wherein said assistance is by suction of said liquid into said capillary gap.

16. The device of claim 1, wherein the device rotates.

17. A device for liquid treatment of an edge of a wafer-shaped article, comprising:
    a base and an annular gas guide element connected to said base and defining gas flow openings between an underside of said gas guide element and said base, said gas guide element comprising a substantially planar upper surface facing said wafer-shaped article and wherein a liquid capillary gap separates the planar upper surface and the wafer-shaped article;
    said base comprising at least one gas conduit that directs gas onto the surface of the wafer-shaped article facing said base and radially outwardly between said underside of said annular gas guide element and said base, wherein the at least one gas conduit opens on said base at a distance from the wafer-shaped article lower than an upper surface of said gas guide element, wherein said gas guide element deflects gas away from the surface of said wafer-shaped article facing said base, wherein said deflection results in differential pressure along the path of gas flow under said wafer-shaped article, and wherein said differential pressure assists in forming said capillary gap.

18. A device for liquid treatment of an edge of a wafer-shaped article, comprising:
    a base and an annular gas guide element connected to said base and defining gas flow openings between an underside of said gas guide element and said base, said gas guide element comprising a substantially planar upper surface facing said wafer-shaped article and wherein a liquid capillary gap separates the planar upper surface and the wafer-shaped article;
    said base comprising at least one gas conduit that directs gas onto the surface of the wafer-shaped article facing said base and radially outwardly between said underside of said annular gas guide element and said base, wherein the at least one gas conduit opens on said base at a distance from the wafer-shaped article lower than an upper surface of said gas guide element, wherein gas exhausted from said gas conduit assists in supporting said wafer-shaped article, wherein said gas guide element deflects gas away from the surface of said wafer-shaped article facing said base, wherein said deflection results in differential pressure along the path of gas flow under said wafer-shaped article, and wherein said differential pressure assists in forming said capillary gap.

* * * * *